(12) United States Patent
Hu et al.

(10) Patent No.: US 11,335,664 B2
(45) Date of Patent: May 17, 2022

(54) INTEGRATED CIRCUIT PACKAGING METHOD AND INTEGRATED PACKAGING CIRCUIT

(71) Applicant: SHENZHEN XIUYUAN ELECTRONIC TECHNOLOGY CO., LTD, Shenzhen (CN)

(72) Inventors: Chuan Hu, Chandler, AZ (US); Junjun Liu, Albany, NY (US); Yuejin Guo, Phoenix, AZ (US); Edward Rudolph Prack, Phoenix, AZ (US)

(73) Assignee: SHENZHEN XIUYUAN ELECTRONIC TECHNOLOGY CO., LTD, Shenzhen (CN)

( * ) Notice: Subject to any disclaimer, the term of this patent is extended or adjusted under 35 U.S.C. 154(b) by 293 days.

(21) Appl. No.: 16/465,233

(22) PCT Filed: Nov. 30, 2016

(86) PCT No.: PCT/CN2016/107832
§ 371 (c)(1),
(2) Date: May 30, 2019

(87) PCT Pub. No.: WO2018/098648
PCT Pub. Date: Jun. 7, 2018

(65) Prior Publication Data
US 2020/0043886 A1 Feb. 6, 2020

(51) Int. Cl.
*H01L 21/48* (2006.01)
*H01L 23/00* (2006.01)
(52) U.S. Cl.
CPC ............ *H01L 24/83* (2013.01); *H01L 21/486* (2013.01); *H01L 24/30* (2013.01); *H01L 2224/27462* (2013.01); *H01L 2224/83851* (2013.01)

(58) Field of Classification Search
CPC ......... H01L 21/486; H01L 2224/04105; H01L 2224/18; H01L 2224/27462;
(Continued)

(56) References Cited

U.S. PATENT DOCUMENTS 5,407,864 A * 4/1995 Kim ................. H01L 24/83
29/834
5,870,289 A * 2/1999 Tokuda ............. H01L 21/6836
361/779

(Continued)

FOREIGN PATENT DOCUMENTS

| CN | 102623427 | 8/2012 |
| CN | 102881799 | 1/2013 |
| CN | 103618041 | 5/2014 |

OTHER PUBLICATIONS

International Search Report issued in application No. PCT/CN2016/107832 dated Jun. 30, 2017.

*Primary Examiner* — Matthew G Landau
*Assistant Examiner* — Dmitriy Yemelyanov
(74) *Attorney, Agent, or Firm* — Hogan Lovells US LLP (57) ABSTRACT

An integrated circuit packaging method and an integrated packaging circuit, the integrated circuit packaging method including: circuit layers are provided on the top surface of a substrate, the bottom surface of the substrate or the interior of the substrate, the circuit layers having circuit pins; the substrate is provided with connection through holes, and the connection through holes are joined up with the circuit pins; a device is placed on the substrate, and the device is provided with device pins on a surface facing the substrate, which makes the device pins join up with a first opening of the connection through holes; conductive layers are fabricated in the connection through holes by means of a second (Continued)

opening of the connection through holes; and the conductive layers electrically connect the device pins to the circuit pins.

13 Claims, 7 Drawing Sheets

(58) Field of Classification Search
CPC . H01L 2224/32225; H01L 2224/83851; H01L 2224/92144; H01L 23/49827; H01L 24/30; H01L 24/83
See application file for complete search history.

(56) References Cited

U.S. PATENT DOCUMENTS

| | | | | |
|---|---|---|---|---|
| 6,037,665 | A * | 3/2000 | Miyazaki | H01L 23/49827 257/773 |
| 2008/0196930 | A1* | 8/2008 | Tuominen | H05K 1/183 174/260 |
| 2010/0120189 | A1* | 5/2010 | Yun | H01L 27/14687 438/57 |
| 2014/0202741 | A1* | 7/2014 | Okamoto | H01L 23/5389 174/252 |

* cited by examiner

INTEGRATED CIRCUIT PACKAGING METHOD AND INTEGRATED PACKAGING CIRCUIT

TECHNICAL FIELD

The present disclosure belongs to the field of electronics, and in particular relates to an integrated circuit packaging method and integrated packaging circuit.

BACKGROUND ART

In a conventional integrated circuit system, a chip is required to be separately packaged and then mounted on a circuit board together with other electronic devices. The chips are attached to the circuit ports of the substrate by using wire bonding or flip-chip methods, and then they are connected to the circuit board. Various materials are used in a large amount, the process is complicated, and the production cost is high; moreover, because of using a large number of materials with different characteristics, multiple problems of thermo-mechanical stresses is easy to be induced at the interface of each material.

Also, inter-chip data communication and circuit connections between the chip and other electronic devices need the chip pins and device pins of the electronic devices as well as the circuits inside the circuit board. There must be sufficient space between the chips and between the chips and other electronic devices, and therefore, the geometric size of the entire system is constrained and cannot be sufficiently miniaturized.

SUMMARY

Based on this, the present disclosure is to overcome the limits of the prior art, and provides an integrated circuit packaging method and an integrated package (packaging) circuit, which has a simple manufacturing process and low cost, and reduces the volume while improving reliability of the integrated package circuit.

Its technical solutions are as follows:

An integrated circuit packaging method includes: a circuit layer is provided on a top surface of a substrate, or on a bottom surface of the substrate, or in the substrate. The circuit layer has circuit pins, the substrate is provided with a connection through hole, and the connection through hole and the circuit pins are butted. The devices are placed on the substrate, and one side of the devices facing the substrate has device pins, so that the device pins are engaged with the first opening of the connection through holes. A conductive layer is formed in the connection through hole through the second opening of the connection through hole, the conductive layer electrically connects the device pin to the circuit pin.

In one of the embodiments, the conductive bonding material is fed into the connecting through hole from the second opening of the connecting through hole during the process of forming the conductive layer in the connecting through hole through the second opening of the connecting through hole. The conductive layer is formed by bonding the conductive bonding material to the inner wall of the connecting through hole and the device pin.

In one of the embodiments, the conductive bonding material is a solder ball, or a solder paste, or a conductive paste, or a conductive metal slurry.

In one of the embodiments, the conductive bonding material is provided in the connecting through hole by using screen printing during the process of forming a conductive layer in the connecting through hole through the second opening of the connecting through hole.

In one of the embodiments, the conductive layer is formed by means of electroplating during the process of forming a conductive layer in the connection through hole through the second opening of the connection through hole.

In one of the embodiments, in the process of mounting the device on the substrate, an adhesive film is provided between the device and the substrate, and the adhesive film bonds the device into the substrate.

In one of the embodiments, during the process of forming a conductive layer in the connection through hole through the second opening of the connection through hole, additional through holes are formed on the adhesive film by using laser melting, plasma cleaning or chemical solvent through the second opening of the connection through hole, the connection through holes are engaged with the device pins by the additional through holes, the conductive layer extends into the additional through holes.

In one of the embodiments, a protective layer is provided on an inner wall of the connecting through hole, which is used for protecting the substrate when the additional through hole is formed.

In one of the embodiments, the integrated circuit packaging method further includes: after the conductive layer is formed, providing an encapsulation layer on the substrate, wherein the two devices are packaged by the encapsulation layer and the substrate; alternatively, after the device is placed on the substrate and before the conductive layer is formed, an encapsulation layer is provided on the substrate, and the two devices are packaged by the encapsulation layer and the substrate.

In one of the embodiments, the devices are at least two.

In one of the embodiments, the integrated circuit packaging method further includes disposing an encapsulation layer on the substrate, at least two devices being packaged by the encapsulation layer and the substrate.

In one of the embodiments, the device is a chip or an electronic device, and at least two devices include at least one chip and at least one electronic device.

In one of the embodiments, the device is a chip, or an electronic device.

In one of the embodiments, the substrate is a flexible circuit board.

In one of the embodiments, the substrate comprises at least two layers of flexible circuit boards, which are in stacked arrangement.

An integrated package circuit comprising: a device, the device is provided with a device pin; a substrate, a circuit layer is provided on a top surface of the substrate, or on a bottom surface of the substrate, or in the substrate, the circuit layer is provided with a circuit pin, the substrate is provided with a connection through hole, the connection through hole is engaged with the circuit pin; wherein the device is mounted on the substrate, the device pin faces the substrate, the first opening of the connection through hole is engaged with the device pin, the second opening of the connection through hole is an operation window, and the connection through hole is provided therein with a conductive layer, and the conductive layer electrically connects the device pin and the circuit pin.

In one of the embodiments, the substrate is a flexible circuit board, or the substrate comprises at least two layers of flexible circuit boards, which are in stacked arrangement.

In one of the embodiments, the circuit layer is a functional circuit, or the circuit layer itself constitutes an electronic device.

In one of the embodiments, the device is mounted on a top surface of the substrate, a top surface of the substrate is provided with the circuit layer, and an insulating medium is provided between the device and the substrate, the insulating medium is provided with an additional through hole, the additional through hole is in communication with the first opening of the connecting through hole, and the conductive layer extends into the additional through hole to be electrically connected to the device pin.

In one of the embodiments, the top surface of the substrate is provided with a circuit layer, or/and the bottom surface of the substrate is provided with a circuit layer, or/and the circuit layer is provided in the substrate, and the device pins are at least two, one of the device pins are electrically connected to at least one of the circuit layers, and the other one of the device pins is electrically connected to at least the other one of the remaining circuit layers.

The beneficial effects of the present disclosure are as follows:

1. The integrated circuit packaging method includes: a circuit layer is provided on a top surface of the substrate, or on a bottom surface of the substrate, or in the substrate, the circuit layer has a circuit pin, and the circuit layer can be formed in advance on the substrate, or can be formed on the substrate when performing the integrated circuit package, the circuit pin may be a connection portion directly led out by the circuit layer, or may be an expansion pin electrically connected to the connection portion, as long as it is possible to electrically connect to the circuit layer through the circuit pin. The substrate is provided with a connection through hole, and the connection through hole on the substrate, if necessary, may be formed on the substrate in advance before packaging, or a connection through hole may be formed on the substrate during the packaging process. The connection through hole is engaged with the circuit pin to place devices on the substrate. When the device is placed on the substrate, the device may be fixed to the substrate or may not be fixed. One side of the device facing the substrate has a device pin, and the device pin of the device includes, but is not limited to, a connection portion that is led out by the inside of the device, and an extension pin that is electrically connected to the connection portion, as long as it is possible to electrically connect to the device through the device pin. The device pin is engaged with the first opening of the connection through hole, and a conductive layer is formed in the connection through hole through the second opening of the connection through hole, the conductive layer electrically connects the device pin and the circuit pin, and the device pin is located on a top surface of the substrate, which can be electrically connected relatively easily with the circuit layer on the top surface; through the second opening of the connection through hole, the device can be electrically connected with the circuit layer from the bottom surface of the substrate, thereby avoiding device blocking the device pin and providing the possibility to achieve more complex wiring design;

In the above, the connection through hole is engaged with the device pin, and the device pin is at least partially located near the first opening of the connection through hole or deep into the connection through hole, so that the conductive layer can be electrically connected to the device pin; the circuit pin is engaged with the connection through hole, and the circuit pin is at least partially located near the first opening of the connection through hole, or near the second opening, or near the inner wall of the connection through hole, so that the conductive layer can be electrically connected to the circuit pin; the device can be a chip or an electronic devices (including but not limited to resistors, capacitors) or other electronic devices (including but not limited to antennas). The device may be fixed to the substrate by connection through hole or a conductive layer, or the device may be fixed to the substrate by other means (including but not limited to bonding, packaging moulded plastics).

Compared with the traditional chip packaging process, this can simplify the process of packaging the integrated circuit system and reduce the cost; further, multiple devices can be mounted simultaneously on a large panel with a large area, and the parallel batch processing on the large panel further reduces cost, saves packaging time. Moreover, this new system package can reduce the thickness of the entirety constituted by the substrate and devices and increase the density of package integration, because there is no need to reserve a gap between the substrate and the devices (in principle, there is no need to reserve a gap, but as needed, other materials can be set between the substrate and devices); the devices can be chips or electronic devices, data communication between chips, or between chips and electronic devices, can be implemented in the substrate, and does not need to bypass to thicker circuit board to realize, which will increase the bandwidth and speed of data communication; the single chip package itself does not require heating and soldering steps; more importantly, the types of the material used in the package of the entire system is greatly reduced and the process is easier to optimize, so as to reduce the strength of thermo-mechanical stress in the packaging by encapsulation layer, such as high-temperature processing project of molded material package, which is of great significance for the introduction of ultra-thin chips and the introduction of flexible circuit boards.

On the other hand, compared with the conventional electronic package using a metal wire to realize electrical connection between the chip and the substrate circuit layer, the present disclosure realizes electrical connection between the first chip and the circuit layer by the way of opening a connection through hole on the substrate, and the conductive layer is provided in the connection through hole, no additional space is occupied, and the overall volume after packaging can be greatly reduced. In particular, the ability to reliably use a flexible circuit board as a substrate is a great advantage.

2. The conductive bonding material is fed into the connecting through hole from the second opening of the connecting through hole during the process of forming the conductive layer in the connecting through hole through the second opening of the connecting through hole, so that the conductive bonding material is bonded to the inner wall of the connection through hole and the device pin to form the conductive layer. By means of feeding the conductive bonding material from the second opening, it is possible to operate on the bottom surface of the substrate without being disturbed by the devices. By using a bonding material with conductivity, the devices at the top layer are firmly bonded to the substrate in the connection through hole to prevent the device from falling off, and meanwhile, to form a conductive path from the device pin of the device to the conductive layer of the substrate, thereby obtaining better conductive connection performance.

3. The conductive bonding material is a solder ball, or a solder paste, or a conductive paste, or a conductive metal slurry, and one or more combinations may be selected according to a process requirement or a substrate material, a size of an inner wall of the connecting through hole, and a surface material property. The process of placing a conductive bonding material to form a conductive connecting channel may use common soldering processes, including surface cleaning, flux spraying, precision placement of solder balls, heat treatment and other steps using a ball-placing machine; or may use more special chemical surface cleaning, surface treatment, precision spraying of solder paste, conductive paste or conductive metal slurry, followed by heat treatment to form mechanical and electrical connections.

4. The conductive bonding material is provided in the connecting through hole by using screen printing during the process of forming a conductive layer in the connecting through hole through the second opening of the connection through hole. Screen printing is a commonly used method for manufacturing circuit layer. For using screen printing to form conductive layer, which equipment is universal and can be synchronized with the fabrication of circuit layer, saving process flow and further reducing cost.

5. The conductive layer is formed by means of electroplating in the process of forming a conductive layer in the connection through hole through the second opening of the connection through hole, and good electrical conductivity can be obtained. Electroplating can better control the thickness of the conductive layer to achieve the desired electrical conductivity.

6. In the process of mounting the device on the substrate, an adhesive film is provided between the device and the substrate, and the adhesive film bonds the device to the substrate. By attaching devices to the substrate by means of bonding by adhesive film, the devices can be fixed to the substrate, thereby saving steps, improving efficiency, and reducing cost. The adhesive film can be insulated, so that even in the case that a circuit layer is provided on the top surface of the substrate, the device pins can be electrically insulated from the circuit layer on the top surface of the substrate, thereby maintaining electrical insulation between the devices. The electrical connection is formed only at the conductive through hole, which is made later. The use of an insulative adhesive film to bond devices and substrates, in conjunction with the fabrication of conductive through holes, provides the possibility to form the circuit by wiring after placing the devices, eliminating the need for performing data communication between devices by circuit in the additional circuit board.

7. During the process of forming a conductive layer in the connection through hole through the second opening of the connection through hole, additional through holes are formed on the adhesive film by using laser melting, plasma cleaning or chemical solvent through the second opening of the connection through hole, the connection through holes are engaged with the device pins by the additional through holes, the conductive layer extends into the additional through holes. The additional through holes are formed to prevent the adhesive film from blocking the electrical connections of the device pins, conductive layers, and circuit pins. The methods including laser melting, plasma cleaning, or chemical solvent etching may be employed as needed.

8. A protective layer is provided on an inner wall of the connecting through hole, and the protective layer is used to protect the substrate when the additional through hole is formed. The additional through hole can be formed by using, but not limited to the process of chemical etching or drilling. In this case, it is necessary to pass through the connection through hole, which may damage the inner wall of the connection through hole, thereby causing damage to the substrate and the circuit layer. The protective layer can protect the inner wall of the connecting through hole from damage. Further, the protective layer may be a material that facilitates electrical connection of the conductive layer, and in this case, the protective layer may be in contact with the circuit pins, which facilitates electrical connection between the circuit pins and the conductive layer. For example, the protective layer may be a metal film, which is sputtered or vapor-deposited on the inner wall of the connection through hole in advance, so that the material of the inner wall of the connection through hole can be protected from being exposed to the etching solvent or ions during the chemical etching process, and moreover, such a thin metal layer can also improve the conductivity of the conductive layer that is subsequently electroplated in the connection through hole.

9. After the conductive layer is formed, an encapsulation layer is provided on the substrate, and the two devices are packaged by the encapsulation layer and the substrate; alternatively, after the device is placed on the substrate and before the conductive layer is formed, an encapsulation layer is provided on the substrate, and the two devices are packaged by the encapsulation layer and the substrate. Packaging the devices by using the encapsulation layer can protect the devices from environmental influences, and the encapsulation layer can cover the substrate, protect the substrate and the circuit layer on the substrate, and avoid bending and scratching. On the other hand, the devices can be fixed to the substrate by the encapsulation layer without additional procedures for fixing the devices.

10. The devices are at least two. The integrated circuit packaging method is applicable to two or more devices. Further, two or more devices can be operated at the same time, and the above devices are mounted on the substrate to realize electrical connection between the devices and the circuit layer, thereby improving efficiency and reducing cost.

11. The device is a chip, or an electronic device. The integrated circuit packaging method is suitable for packaging of chips or electronic devices. The electronic devices include but not limited to independent resistors, capacitors, inductors, diodes, or transistors and the chips include but not limited to bare chip, wafer, or packaged integrated chip. The chips or electronic devices can be packaged using the same equipment and process flow to reduce cost.

14. The integrated circuit packaging method further includes disposing an encapsulation layer on the substrate, at least two devices are packaged by the encapsulation layer and the substrate. The purpose of the encapsulation layer is mainly to protect the devices from the effects of the external environmental factors, such as the effects of water vapor and electromagnetic radiation on the electrical properties of the devices. Moreover, it also fixes the relative position of multiple devices on the substrate to ensure the stability of the electrical connection. In this disclosure, after curing, it acts more as a support plate, so that we can then conveniently make the conductive layer of the inner wall of the connection through hole on the substrate.

13. When the devices are at least two, the devices are chips or electronic devices, and at least two devices include at least one chip and at least one electronic device. The chips and electronic devices can be packaged at the same time to increase efficiency and reduce cost.

14. The substrate is a flexible circuit board; or the substrate includes at least two layers of flexible circuit boards, which are in stacked arrangement. The device is mounted on the substrate by the integrated circuit packaging method, and the electrical connection between the device and the circuit layer on the substrate is realized. When the substrate is a flexible circuit board or a multilayer flexible circuit board, the overall flexibility can be maintained, which can be used for wearable devices, etc.

15. An integrated package circuit comprising: a device, the device is provided with a device pin; a substrate, a circuit layer is provided on a top surface of the substrate, or on a bottom surface of the substrate, or in the substrate, the circuit layer is provided with a circuit pin, the substrate is provided with a connection through hole, the connection through hole is engaged with the circuit pin; wherein the device is mounted on the substrate, the device pin faces the substrate, a first opening of the connection through hole is engaged with the device pin, a second opening of the connection through hole is an operation window, and a conductive layer is provided in the connection through hole, and the conductive layer electrically connects the device pin and the circuit pin. For connecting the connection through holes and forming conductive layer, the manufacturing process is simple and the cost is low, thereby ensuring the performance of the integrated package circuit.

16. The substrate is a flexible circuit board, or the substrate includes at least two layers of flexible circuit boards, which are in stacked arrangement. By means of the structural arrangement of the integrated package circuit, when the substrate is a flexible circuit board or a multilayer flexible circuit board, the overall flexibility can be maintained, which can be used for a wearable devices or the like.

17. The circuit layer is a functional circuit, the circuit layer has a certain electronic function; or the circuit layer itself constitutes an electronic device, including but not limited to an antenna. The circuit layer of the integrated package circuit structure has a wide application range and can realize integration of various functions.

18. The device is mounted on a top surface of the substrate, the top surface of the substrate is provided with the circuit layer, an insulating medium is provided between the device and the substrate, and the insulating medium is provided with an additional through hole. The additional through hole is in communication with the first opening of the connection through hole, and the conductive layer extends into the additional through hole to be electrically connected to the device pin. An insulating medium is provided between the device and the substrate to prevent the device from affecting the circuit layer or other conductive structure on the top surface of the substrate. The device may have more than two device pins, some of the device pins are connected to the substrate or the circuit layer by the integrated circuit packaging method of the present disclosure, and the insulating medium can prevent the influence of the other device pins on the substrate or the circuit layer. Further, the insulating medium can be selected as a viscous material to bond and fix the device on the substrate.

19. The top surface of the substrate is provided with a circuit layer, or/and the bottom surface of the substrate is provided with a circuit layer, or/and the circuit layer is provided in the substrate, and the device pins are at least two, one of which is electrically connected to at least one of the circuit layers, and the other one of the device pins is electrically connected to at least the other one of the remaining circuit layers. The substrate is provided with two or more circuit layers, and the devices are simultaneously electrically connected to at least two layers of different circuit layers through different device pins, which expands the circuit function.

DESCRIPTION OF THE REFERENCE SIGNS 100, substrate, 110a, 110b, circuit layer, 120a, 120b, connection through hole, 120c, first opening, 120d, second opening, 121a, 121b, protective layer, 200, device, 210a, 210b, device pin, 300, insulating medium, 400a, 400b, conductive layer.

DETAILED DESCRIPTION OF EMBODIMENTS

The present disclosure will be further described in detail below, but embodiments of the present disclosure are not limited thereto.

Embodiment 1

Figure 5:
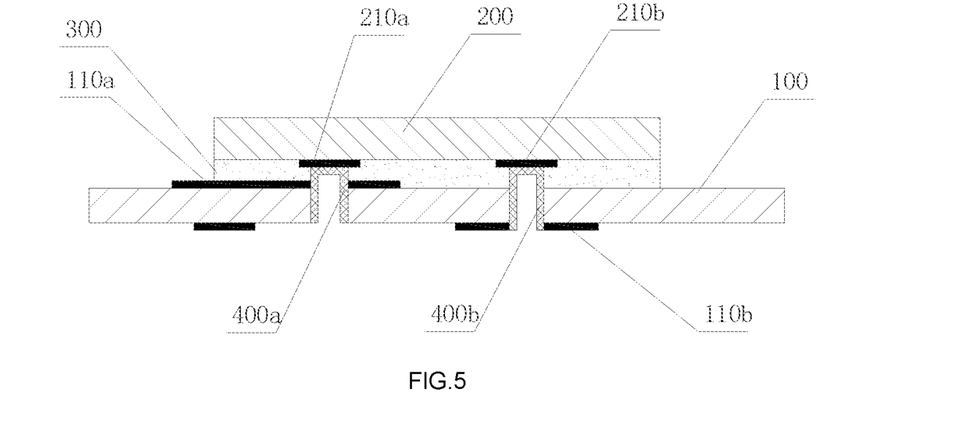
FIG. 5 is a fifth schematic diagram of an integrated circuit packaging method according to an embodiment 1 of the present disclosure.

In this embodiment, as shown in FIG. 5, the integrated package circuit includes: a device 200 and a substrate 100. The device 200 is mounted on the top surface of the substrate 100. The top surface and the bottom surface of the substrate 100 are respectively provided with circuit layers 110a and 110b. The insulating medium 300 is provided between the device 200 and the substrate 100 (in the embodiment, the insulating medium 300 is also an adhesive film). The device 200 is provided with device pins 210a, 210b, the device pins 210a, 210b face the substrate 100, the circuit layers 110a, 110b are provided with circuit pins, and the substrate 100 is provided with connection through holes 120a, 120b, and the connection through holes 120a, 120b are engaged with the circuit pins, the first opening 120c of the connection through holes 120a, 120b is engaged with the device pins 210a, 210b, the second opening 120d of the connection through holes 120a, 120b is an operation window, and the insulating medium 300 (adhesive film) is provided with the additional through holes, the additional through holes are in communication with the first openings 120c of the connection through holes 120a, 120b. The connecting through holes 120a, 120b are provided therein with conductive layers 400a, 400b, and the conductive layers 400a, 400b extend into the additional through holes and are electrically connected with the device pins 210a, 210b. In the above, the insulating medium 300 separates the device 200 from the substrate 100. The insulating medium 300 (adhesive film) can prevent the device 200 from affecting the circuit layers 110a, 110b or other conductive structures on the top surface of the substrate 100. There may be more than two device pins 210a, 210b on the device 200, wherein some of the device pins 210a, 210b are connected to the substrate 100 or the circuit layers 110a, 110b by the integrated circuit packaging method of the present disclosure, and the insulating medium 300 can avoid additional device pins 210a and 210b from affecting the substrate 100 or the circuit layers 110a and 110b. In the present embodiment, the insulating medium 300 is also an adhesive film, and the insulating medium 300 (adhesive film) bonds the device 200 to the substrate 100. The device 200 is placed on the substrate 100 by means of bonding, and the device 200 can be fixed to the substrate 100 by the process of placing the device 200 on the substrate 100, thereby saving steps, improving efficiency, and reducing cost. However, not limited to this, the insulating medium 300 can only function as the isolation of the device 200 and the substrate 100, and the device 200 is fixed to the substrate 100 by using another method, alternatively, the device 200 may be attached to the substrate 100 by using an adhesive film, and however, the adhesive film does not function to isolate the device 200 from the substrate 100.

Figure 1:
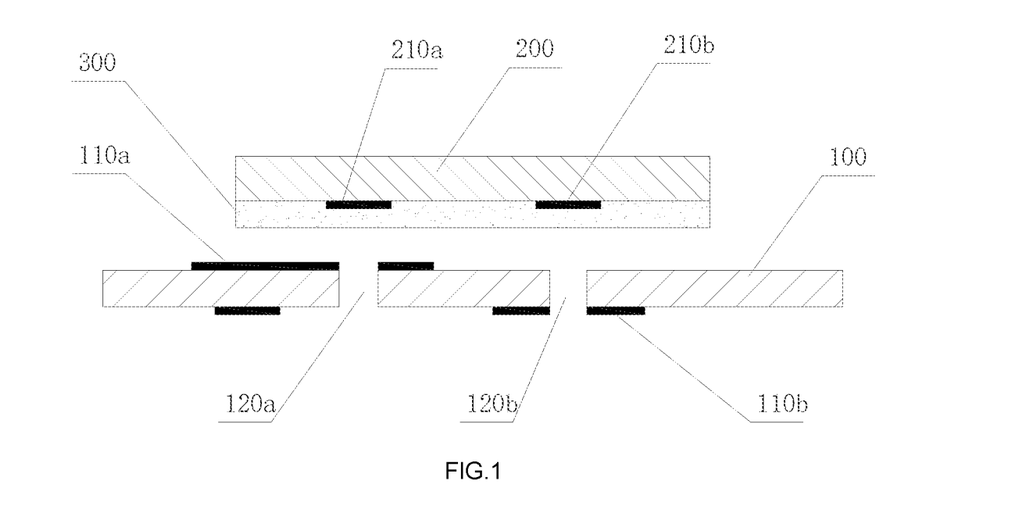
FIG. 1 is a first schematic diagram of an integrated circuit packaging method according to an embodiment 1 of the present disclosure.
Figure 2:
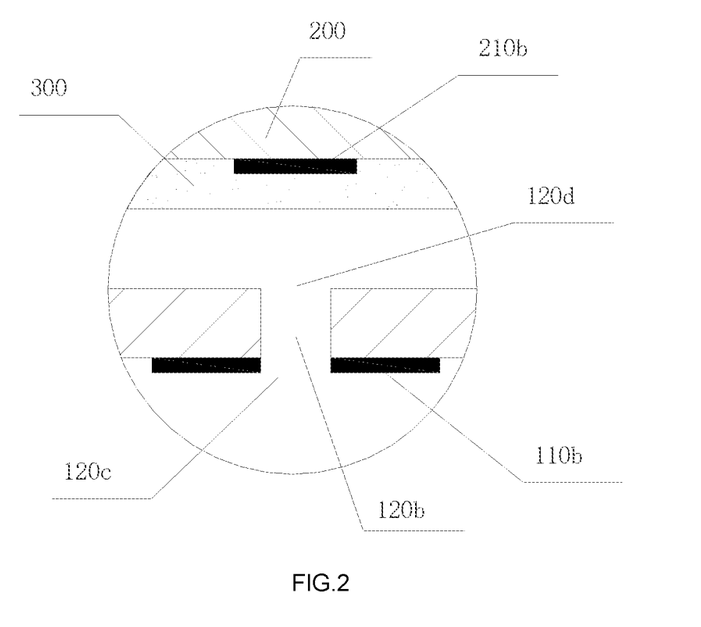
FIG. 2 is a second schematic diagram of an integrated circuit packaging method according to an embodiment 1 of the present disclosure.

In this embodiment, the integrated circuit packaging method includes: as shown in FIG. 1 and FIG. 2, the top surface and the bottom surface of the substrate 100 respectively have circuit layers 110a and 110b, and the circuit layers 110a and 110b have circuit pins. In this embodiment, the circuit layers 110a and 110b are formed on the substrate 100 in advance, but not limited to this, the circuit layers 110a and 110b also may be formed on the substrate 100 during the integrated circuit package. The circuit pins may be a connection portion directly led out from the circuit layers 110a and 110b, or may be an extension pin electrically connected to the connection portion, as long as it is possible to electrically connect to the circuit layers 110a and 110b through the circuit pins. The device pins 210a, 210b of the device 200 include, but are not limited to, a connection portion led out from the inside of the device 200 and an extension pin electrically connected to the connection portion, as long as it is possible to electrically connect to the device 200 through the device pins 210a, 210b. The device pins 210a, 210b are engaged with the first openings 120c of the connection through holes 120a, 120b. The substrate 100 is provided with the connection through holes 120a and 120b. The connection through holes 120a and 120b are engaged with the circuit pins. In this embodiment, the connection through holes 120a and 120b are formed in advance on the substrate 100, but are not limited thereto. As needed, the connection through holes 120a and 120b can be formed on the substrate 100 in advance, and then the integrated circuit package is performed, and the connection through holes 120a and 120b may also be formed on the substrate 100 during the integrated circuit package process.

Figure 3:
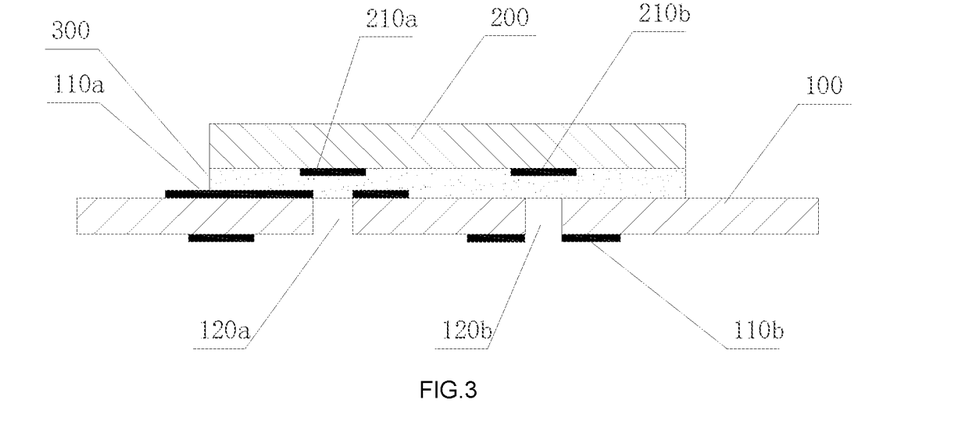
FIG. 3 is a third schematic diagram of an integrated circuit packaging method according to an embodiment 1 of the present disclosure.

As shown in FIG. 3, one side of the device 200 on which the device pins 210a and 210b are provided is coated with an adhesive film (not limited to this embodiment, the adhesive film can be coated to the substrate 100). One side of the device 200 having device pins 210a and 210b faces the substrate 100, and the device 200 is placed on the substrate 100. At this time, the adhesive film mounts the device 200 on the substrate 100. (In the embodiment, the adhesive film is also the insulating medium 300, and is not limited to the embodiment, the adhesive film bonding device 200 may not be used.)

Figure 4:
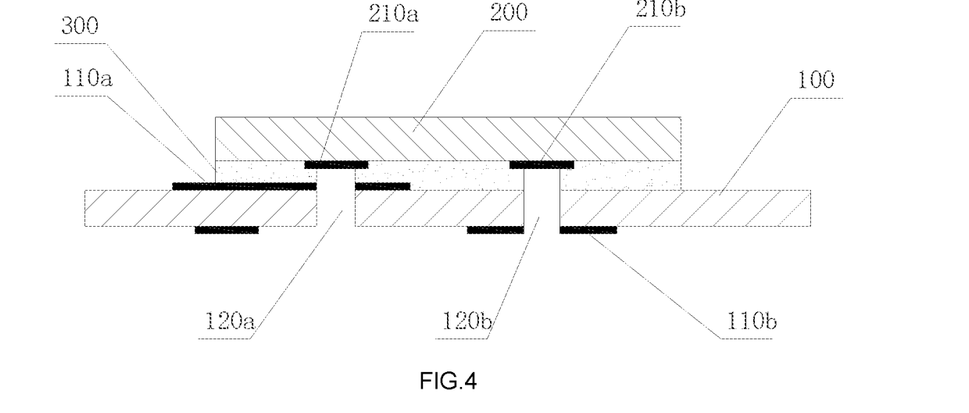
FIG. 4 is a fourth schematic diagram of an integrated circuit packaging method according to an embodiment 1 of the present disclosure.

As shown in FIG. 4, through the second opening 120d of the connection through holes 120a, 120b, an additional through hole is formed on the adhesive film by using laser melting, plasma cleaning, or a chemical solvent, and the connection through holes 120a, 120b are engaged with the device pins 210a, 210b through the additional through hole to prevent the adhesive film from blocking the electrical connections of device pins 210a and 210b, conductive layers 400a and 400b, and circuit pins.

As shown in FIG. 5, conductive layers 400a, 400b are formed in the connection through holes 120a, 120b through the second openings 120d of connection through holes 120a, 120b, and the conductive layers 400a, 400b extend into the additional through holes, and the conductive layers 400a, 400b electrically connect the device pins 210a, 210b and the circuit pins; the device pins 210a, 210b are located on the top surface of the substrate 100, and the device pins 210a, 210b of the devices 200 can be electrically connected with the circuit layers 110a, 110b from the bottom surface of the substrate 100 through the second openings 120d of the connection through holes 120a, 120b, thus avoiding the blocking of the devices 200 to the device pins 210a, 210b at the top portion.

Packaging according to the above method can reduce the cost of the integrated circuit package and save packaging time. Moreover, the overall thickness of the substrate 100 and the device 200 is reduced, and even no gap is required to reserve between the substrate 100 and the device 200 (in principle, no gap is required to reserve, but other material can be provided between the substrate 100 and the device 200 as needed); the step of heat welding is not required, especially for the packaging of the ultra-thin chip 200 and the flexible circuit board, the overall thermo-mechanical stress distribution of the system caused by relatively large temperature changes, and the influence on the performance of the device 200 can be avoided.

In addition, after the conductive layers 400a and 400b are formed, an encapsulation layer is provided on the substrate 100, and the device 200 is packaged by the encapsulation layer and the substrate 100. Alternatively, after the device 200 is placed on the substrate 100 and before the conductive layers 400a and 400b are formed, an encapsulation layer is provided on the substrate 100, and the two devices 200 are packaged by the encapsulation layer and the substrate 100. The device 200 is packaged by an encapsulation layer, which can be protect the device 200, and the encapsulation layer can cover the substrate 100 and protect the substrate 100 and the circuit layers 110a and 110b on the substrate 100 from being bent or scratched. On the other hand, the device 200 can be fixed to the substrate 100 by an encapsulation layer without requiring an additional program to fix the device 200.

In the above, the connection through holes 120a, 120b are engaged with the device pins 210a, 210b, and the device pins 210a, 210b are at least partially located adjacent to the first opening 120c of the connection through holes 120a, 120b or deep into the through holes 120a, 120b, such that the conductive layers 400a, 400b can be electrically connected to the device pins 210a, 210b; the circuit pins are engaged with the connection through holes 120a, 120b, the circuit pins are at least partially located at the vicinity of the first opening 120c of the connection through holes 120a, 120b, or the vicinity of the second opening 120d or the vicinity of the inner wall of the connecting through holes 120a, 120b, so that the conductive layers 400a, 400b can be electrically connected to the circuit pins; the device 200 can be a chip or electronic devices (including but not limited to resistors, capacitors) or other electronic devices (including but not limited to antennas). The device 200 may be fixed to the substrate 100 through the connection through holes 120a, 120b and the conductive layers 400a, 400b, or the device 200 may be fixed to the substrate 100 by other means (including, but not limited to, bonding or packaging moulded plastics).

Figure 9:
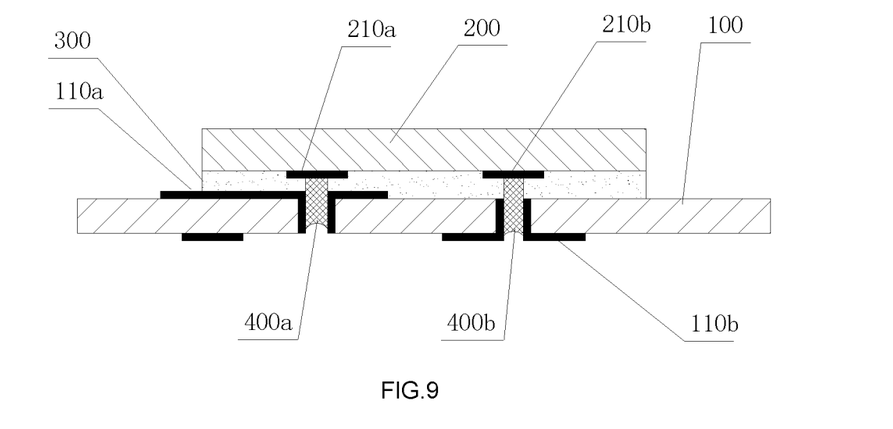
FIG. 9 is a fourth schematic diagram of an integrated circuit packaging method according to embodiment 2 of the present disclosure.

In the above, during the process of forming the conductive layers 400a, 400b in the connection through holes 120a and 120b through the second openings 120d of the connection through holes 120a, 120b, the conductive bonding material is fed from the second openings 120d of the connection through holes 120a, 120b into the connection through holes 120a, 120b, such that the conductive bonding material is bonded to the inner walls of the connection through holes 120a, 120b and the device pins 210a, 210b to form the conductive layers 400a, 400b. By means of feeding the conductive bonding material from the second opening 120d, the operation can be performed on the back surface of the substrate 100 without being disturbed by the device 200, and the conductive bonding material is adhered to the inner walls of the connection through holes 120a, 120b and the device pins engaged with the connection through holes by means of bonding, which can form mechanical and electrical connections at the same time after proper heating or chemical treatment, and also ensure stable conductive connection performance. The conductive bonding material is a solder ball, or a solder paste, or a conductive paste, or a conductive metal slurry, and the structure shown in FIG. 9 is formed, and one or more combinations can be selected according to the process requirements or the material of the substrate 100 and the properties of the inner walls of the connecting through holes 120a and 120b.

Alternatively, in the process of forming the conductive layers 400a, 400b in the connection through holes 120a and 120b through the second openings 120d of the connection through holes 120a, 120b, a conductive bonding material is provided in the connection through holes 120a, 120b by screen printing. The screen printing is a common manufacturing method for the circuit layers 110a and 110b. The conductive layers 400a and 400b are formed by the way of the screen printing, which device is universal and can be synchronized with the fabrication of the circuit layers 110a and 110b, which saves the process flow and further reduces the cost.

Alternatively, during the process of forming the conductive layers 400a, 400b in the connection through holes 120a, 120b through the second openings 120d of the connection through holes 120a, 120b, the conductive layers 400a, 400b are formed by means of electroplating to form a structure as shown in FIG. 5. Good electrical conductivity can be obtained, and the electroplating can control the thickness of the conductive layers 400a, 400b to obtain desired electrical conductivity.

Further, a plurality of devices 200 can be simultaneously mounted on a large panel with a large area, and the batch processing on the large panel further reduces the cost and saves the packaging time. In batch production, a plurality of sets of devices 200 are arranged on a carrier by using a carrier with a large flat plate, the carrier is covered on the top surface of the substrate 100, and the device 200 is attached to the substrate 100 using an adhesive film to disengage the carrier and the device 200. (It may be that the device 200 is mounted on the carrier by using a photosensitive or heat sensitive material, the temperature or the illumination is changed to disengage the carrier and the device 200), and then the above steps 2-4 are performed, and finally the substrate 100 is cut to a plurality of daughter boards according to a predetermined grouping, each of which corresponds to a set of devices 200, each of which is independent. In this way, packaging operations can be performed in large batch, which greatly improves the production efficiency (wherein the adhesive film can be an insulating material at the same time).

In this embodiment, the top surface and the bottom surface of the substrate 100 are respectively provided with circuit layers 110a and 110b, and the chip is electrically connected to the circuit layers 110a and 110b at the same time. However, not limited to this, the circuit layers 110a, 110b can be embedded in the substrate 100, the device pins 210a, 210b are electrically connected to the circuit layers 110a, 110b, or the top surface of the substrate 100 is provided with circuit layers 110a, 110b, or/and the bottom surface of the substrate 100 is provided with circuit layers 110a, 110b, or/and the circuit layers 110a, 110b are provided in the substrate 100, and the device pins 210a, 210b are at least two, one of the device pins 210a, 210b is electrically connected to at least one of the circuit layers 110a, 110b, and the other one of the device pins 210a, 210b is electrically connected to at least the other one of the remaining circuit layers 110a, 110b. The substrate 100 is provided with two or more circuit layers 110a and 110b. The device 200 is simultaneously electrically connected to at least two layers of different circuit layers 110a and 110b through different device pins 210a and 210b, which expands the circuit function.

In this embodiment, the substrate 100 may be a flexible circuit board; or the substrate 100 includes at least two layers of flexible circuit boards, which are in stacked arrangement. The device 200 is mounted on the substrate 100 by the integrated circuit packaging method, realizing the electrical connection between the device 200 and the circuit layers 110a and 110b on the substrate 100. The overall thickness of the device 200 and the substrate 100 is small, and the overall flexibility can be maintained, which can be used for wearable devices, etc.

In the above, the device 200 is a chip or an electronic device. The integrated circuit packaging method is suitable for packaging of chips or electronic devices, the electronic devices include but not limited to independent resistors, capacitors, inductors, diodes, or transistors, and the chips include but not limited to bare chip, wafer, or packaged integrated chip. The chips or electronic devices can be packaged using the same equipment and process flow, reducing costs.

In the above, FIGS. 1 to 6 only illustrate the structure of the single device 200, but not limited to this, and the device 200 may be at least two. The integrated circuit packaging method is applicable to two or more devices 200. Further, two or more devices 200 can be simultaneously operated, and the above devices 200 are mounted on the substrate 100, and the electrical connection between the device 200 and the circuit layer 110a, 110b is realized, which improves efficiency and reduces cost. When the devices 200 are at least two, it may be that at least two devices 200 include at least one chip and at least one electronic device. Chips and electronic devices can be packaged at the same time to increase efficiency and reduce cost. When an encapsulation layer is provided on the substrate 100, it is optional to package a single device 200 or package two or more devices 200. The purpose of the encapsulation layer is mainly to protect the devices from the influence of the external environmental factors, such as the influence of water vapor and electromagnetic radiation on the electrical properties of the devices. Meanwhile, it also fixes the relative position of multiple devices on the substrate to ensure the stability of the electrical connection. In this disclosure, after curing, it acts more as a support plate, so that we can then conveniently make the conductive layer of the inner wall of the connection through hole on the substrate. In addition, two or more encapsulation layers may be provided on one substrate 100, and the encapsulation layers may have a gap between each other, which can provide a larger curvature, so that the whole of the substrate 100, the device 200, and the encapsulation layer is more flexible. In particular, when the substrate 100 is a flexible circuit board or substantially constituted by more than two layers of flexible circuit boards, the integrated package circuit can maintain such flexibility, so that the integrated package circuit can be applied to occasions, for example, wearable devices, that need to remain flexible.

In the above, the circuit layers 110a, 110b are functional circuits, and the circuit layers 110a, 110b have certain electronic functions; or the circuit layers 110a, 110b themselves constitute electronic devices, including but not limited to antennas. The circuit layers 110a, 110b of the integrated package circuit structure have a wide range of applications, and can realize integration of various functions.

Embodiment 2

The difference between the embodiment 2 and the embodiment 1 is as follows:

The protective layers 121a and 121b are provided on the inner walls of the connection through holes 120a and 120b, and the protective layers 121a and 121b are used to protect the substrate 100 when the additional through holes are formed. The protective layers 121a and 121b may be formed on the substrate 100 in advance before the integrated circuit package is performed, or the protective layers 121a and 121b may be formed before the conductive layers 400a and 400b are formed. The additional through holes may be formed by using, but not limited to, a chemical etching or a drilling process. In this case, it is necessary to pass through the connection through holes 120a, 120b, which may damage the material of the inner wall of the connection through holes 120a, 120b, thus causing damage to the substrate 100, and the circuit layers 110a, 110b, and the protective layers 121a, 121b can protect the inner walls of the connection through holes 120a, 120b from damage during the process of making the connection through holes or the additional through holes. Further, the protective layers 121a, 121b may be materials that facilitate the electrical connection of the conductive layers 400a, 400b. At this time, the protective layers 121a, 121b may be in contact with the circuit pins to facilitate the electrical connection between the circuit pins and the conductive layers 400a, 400b.

Alternatively, the inner walls of the connection through holes 120a, 120b are provided with an auxiliary layer, which is used for assisting in the fabrication of the conductive layers 400a, 400b, so that the conductive layers 400a, 400b are better electrically connected to the device pins 210a, 210b, and the circuit pins, or better attached to the inner wall of the connecting through holes 120a, 120b.

Figure 6:
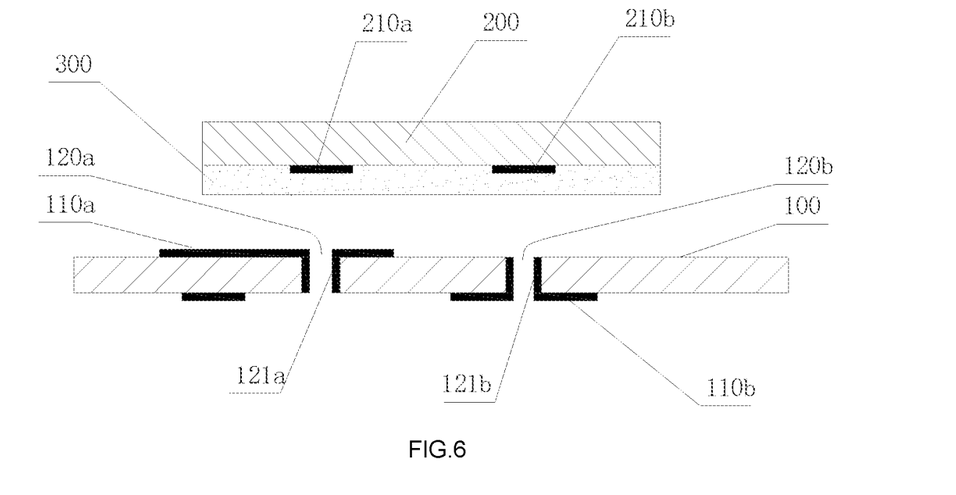
FIG. 6 is a first schematic diagram of an integrated circuit packaging method according to embodiment 2 of the present disclosure.
Figure 7:
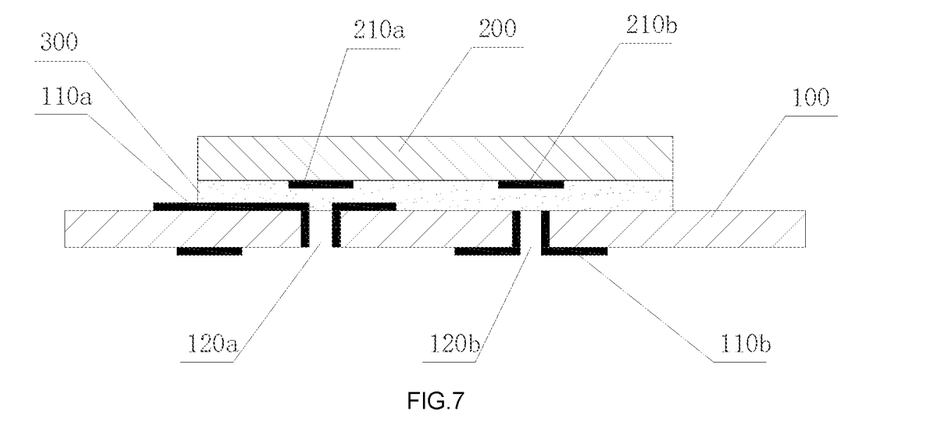
FIG. 7 is a second schematic diagram of an integrated circuit packaging method according to embodiment 2 of the present disclosure.
Figure 8:
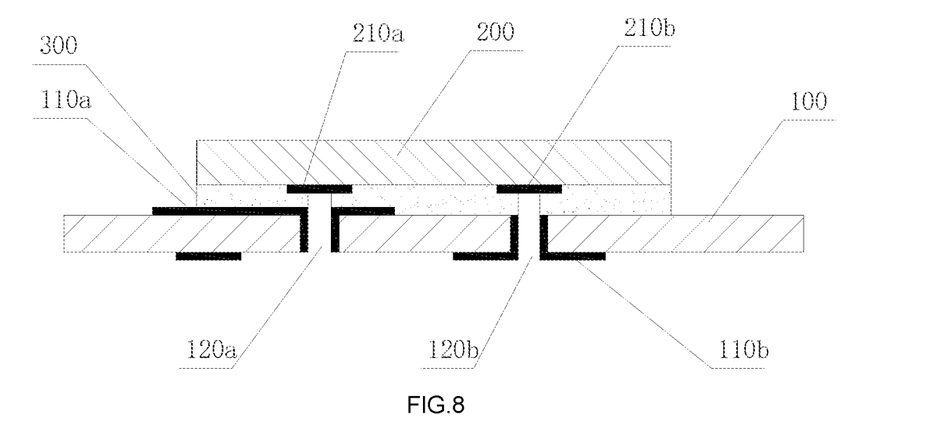
FIG. 8 is a third schematic diagram of an integrated circuit packaging method according to embodiment 2 of the present disclosure.
Figure 13:
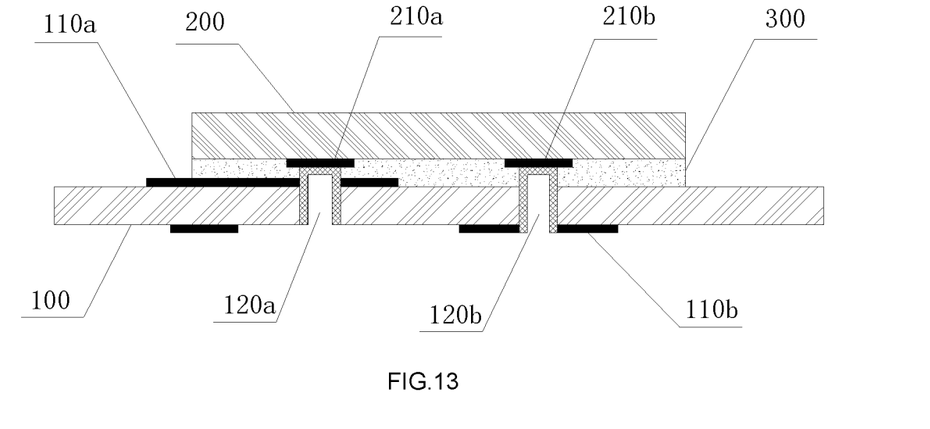
FIG. 13 is a fourth schematic diagram of an integrated circuit packaging method according to embodiment 3 of the present disclosure.

As shown in FIGS. 6 to 9, in the present embodiment, the inner walls of the connection through holes 120a, 120b are provided with protective layers 121a, 121b, and the protective layers 121a, 121b are also auxiliary layers, and the protective layers 121a, 121b (auxiliary layers) are made of the same material as the circuit layers 110a and 110b. For example, the circuit layers 110a and 110b are made of copper, and the protective layers 121a and 121b (auxiliary layers) are also made of copper, which further improves the electrical connection performance. However, it is not limited to this embodiment, and other materials may be used as needed, and the protective layers 121a, 121b providing protection or the auxiliary layers for auxiliary electrical connection may be separately provided. As shown in FIG. 6, in this embodiment, the protective layers 121a, 121b (auxiliary layers) are electrically connected to the circuit layers 110a, 110b, as shown in FIG. 7, the device 200 is placed on the substrate 100, and the adhesive film (insulating medium 300) bonds the device 200 to the substrate 100; as shown in FIG. 8, an auxiliary through hole is formed on the adhesive film (insulating material); as shown in FIG. 9, a conductive layers 400a, 400b are formed in the connecting through holes 120a, 120b, the conductive layers 400a, 400b electrically connect the device pins 210a, 210b and circuit pins, wherein the form of the conductive layers 400a and 400b shown in FIG. 9 is formed by a method of using solder balls. However, not limited to this, the conductive layers 400a and 400b may also be formed by the method of electroplating. FIG. 13 shows the form of the conductive layer obtained finally. The auxiliary layer (protective layer 121a, 121b) is directly electrically connected to the circuit pin, which electrical connection effect is good, and can extend the circuit pin to reduce the volume of the conductive layers 400a, 400b, which is beneficial to the fabrication of the conductive layers 400a, 400b, and is also advantageous for reducing cost.

Embodiment 3

Figure 10:
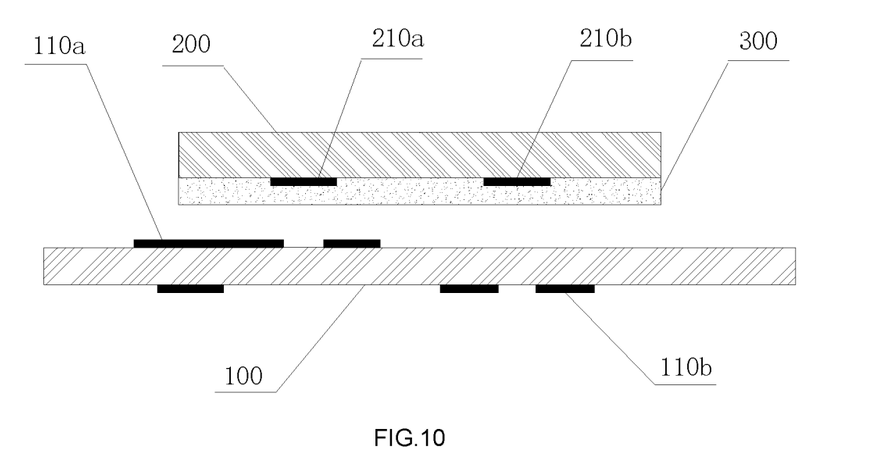
FIG. 10 is a first schematic diagram of an integrated circuit packaging method according to embodiment 3 of the present disclosure.

The difference between the embodiment 3 and the embodiment 1 is as follows:

The connection through holes 120a, 120b are further fabricated during the packaging process, including the steps of:

As shown in FIG. 10, the top surface and the bottom surface of the substrate 100 have circuit layers 110a and 110b, respectively, and the circuit layers 110a and 110b have circuit pins.

Figure 11:
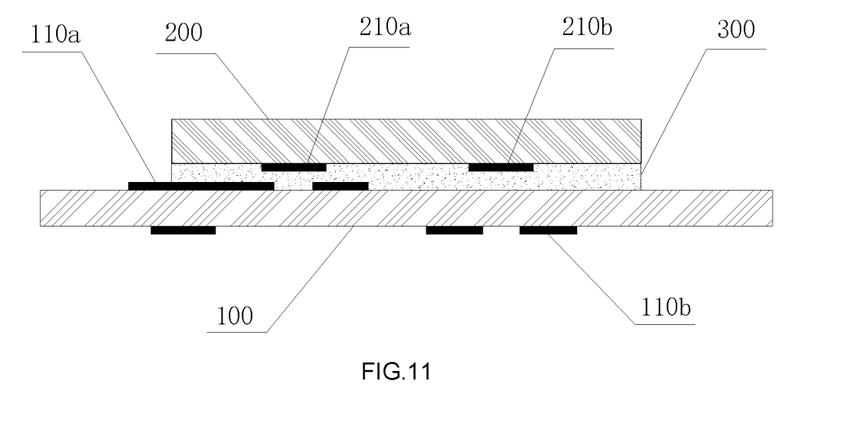
FIG. 11 is a second schematic diagram of an integrated circuit packaging method according to embodiment 3 of the present disclosure.

As shown in FIG. 11, one side of the device 200 on which the device pins 210a and 210b are provided is coated with an adhesive film (not limited to this embodiment, the adhesive film can be coated to the substrate 100), and one side of the device 200 having a device pins 210a and 210b faces the substrate 100, and the device 200 is placed on the substrate 100, and at this time, the adhesive film mounts the device 200 on the substrate 100.

Figure 12:
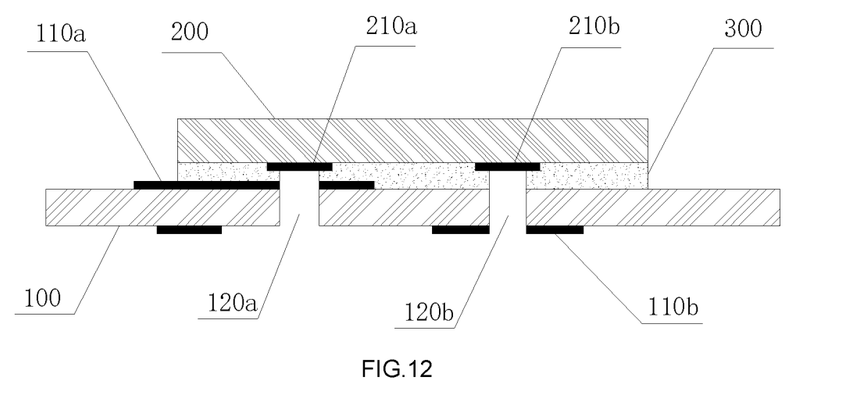
FIG. 12 is a third schematic diagram of an integrated circuit packaging method according to embodiment 3 of the present disclosure.

As shown in FIG. 12, connection through holes 120a, 120b are formed on the substrate 100, such that the device pins 210a, 210b are engaged with the first openings 120c of the connection through holes 120a, 120b. The second openings 120d of the connection through holes 120a, 120b is adapted to form conductive layers 400a, 400b in the connection through holes 120a, 120b, and the additional through holes are formed on the adhesive film, and the connection through holes 120a, 120b is engaged with the device pins 210a, 210b through the additional through holes.

As shown in FIG. 13, the conductive layers 400a, 400b are formed in the connection through holes 120a, 120b through the second openings 120d of the connection through holes 120a, 120b, and the conductive layers 400a, 400b extend into the additional through holes, and through the conductive layers 400a, 400b, the device pins 210a, 210b are electrically connected to the circuit pins.

In the present embodiment, the circuit layers 110a and 110b are formed on the substrate 100 in advance. However, not limited to this, the circuit layers 110a and 110b may also be formed on the substrate 100 during integrated circuit package according to the needs of wiring and reducing cost. For example, the conductive layers 400a, 400b are formed by means of electroplating. It is also possible to produce a part of the circuit layers 110a, 110b in advance, and to form another part of the circuit layers 110a, 110b on the substrate 100 during the integrated circuit package. Prior to electroplating, an auxiliary layer is formed by using a sputtering or vapor deposition process. The process of forming the conductive layers 400a, 400b by means of electroplating further includes forming an auxiliary layer by using a sputtering or vapor deposition process before electroplating, and then electroplating. The sputtered or vapor-deposited auxiliary layer can be better electrically connected to the circuit pins, and the electroplated conductive layers 400a, 400b are attached to the auxiliary layer. Sputtering or vapor deposition of the auxiliary layer can improve the quality of the electroplating on the one hand, and can better achieve the electrical connection between the conductive layers 400a, 400b and the circuit pins on the other hand. A release layer is provided on the bottom surface of the substrate 100, and the release layer has model slots having a similar contour with the circuit layers 110a and 110b. After the connection through holes 120a and 120b are formed, the circuit layers 110a and 110b are formed in the model slots while the conductive layers 400a and 400b are formed, for example, the conductive layers 400a and 400b are formed by means of electroplating, and the circuit layers 110a and 110b are formed in the model slots while electroplating.

Each of the technical features of the above embodiments may be arbitrarily combined. For the sake of brevity of description, all possible combinations of each of the technical features in the above embodiments are not described. However, as long as there is no contradiction in the combination of these technical features, it should be considered to be the range described in the present specification.

The above embodiments are merely illustrative of several embodiments of the present disclosure, and the description thereof is relatively specific and detailed, but is not to be construed as limiting the scope of the present disclosure. It should be noted that a number of variations and improvements may be made by those ordinarily skilled in the art without departing from the concept of the present disclosure, which all fall within the protection scope of the present disclosure. Therefore, the protection scope of the present disclosure should be determined by the appended claims.

The invention claimed is:

1. An integrated circuit packaging method, comprising:
   a circuit layer being provided on a top surface of a substrate, or on a bottom surface of the substrate, or in the substrate, wherein the circuit layer is provided with circuit pins, the substrate is provided with a connection through hole; the connection through hole is engaged with the circuit pins, at least one device is placed on the substrate, one side of the at least one device facing the substrate is provided with device pins, such that each of the device pins is engaged with a first opening of the connection through hole, a conductive layer is formed in the connection through hole through a second opening of the connection through hole, and the conductive layer electrically connects the device pins and the circuit pins,
   a protective layer is provided on an inner wall of the connection through hole, wherein the protective layer is a metal film sputtered or vapor-deposited on the inner wall of the connection through hole in advance,
   wherein during a process of forming the conductive layer in the connection through hole through the second opening of the connection through hole, a conductive bonding material is fed into the connection through hole from the second opening of the connection through hole, such that the conductive bonding material is bonded on the inner wall of the connection through hole and the device pins to form the conductive layer,
   wherein an adhesive film is provided between the at least one device and the substrate and the adhesive film bonds the at least one device to the substrate, and
   wherein an additional through hole is formed on the adhesive film by using laser melting, plasma cleaning, or a chemical solvent through the second opening of the connection through hole, the connection through hole is engaged with the corresponding device pin through the additional through hole, and the conductive layer extends into the additional through hole.

2. The integrated circuit packaging method according to claim 1, wherein the conductive bonding material is a solder ball, or a solder paste, or a conductive paste, or a conductive metal slurry.

3. The integrated circuit packaging method according to claim 1, wherein the conductive bonding material is provided in the connection through hole by using screen printing.

4. The integrated circuit packaging method according to claim 1, wherein the conductive layer is formed by means of electroplating.

5. The integrated circuit packaging method according to claim 1, wherein the protective layer is used to protect the substrate when the additional through hole is fabricated.

6. The integrated circuit packaging method according to claim 1, wherein the at least one device are in number of at least two.

7. The integrated circuit packaging method according to claim 1, wherein the at least one device is a chip or an electronic device.

8. The integrated circuit packaging method according to claim 1, wherein the substrate is a flexible circuit board; or the substrate comprises at least two layers of flexible circuit boards, which are in stacked arrangement.

9. An integrated package circuit, comprising:
   at least one device, wherein the at least one device is provided with device pins;
   a substrate, wherein a circuit layer is provided on a top surface of the substrate, or on a bottom surface of the substrate, or in the substrate, the circuit layer is provided with circuit pins, the substrate is provided with a connection through hole, and the connection through hole is engaged with the circuit pins; and wherein the at least one device is mounted on the substrate, the device pins face the substrate, a first opening of the connection through hole is engaged with one device pin, a second opening of the connection through hole is an operation window, a conductive layer is provided in the connecting through hole, and the conductive layer electrically connects the device pins and the circuit pins, wherein a protective layer is provided on an inner wall of the connection through hole, wherein the protective layer is a metal film sputtered or vapor-deposited on the inner wall of the connection through hole in advance, wherein the at least one device is mounted on the top surface of the substrate, the circuit layer is provided on the top surface of the substrate, an insulating medium is provided between the at least one device and the substrate, the insulating medium is provided with an additional through hole, the additional through hole is in communication with the first opening of the connection through hole, and the conductive layer extends into the additional through hole to be electrically connected to the device pin, and wherein the insulating medium is an adhesive film and the additional through hole is configured to be formed on the adhesive film by using laser melting, plasma cleaning, or a chemical solvent through the second opening of the connection through hole.

10. The integrated package circuit according to claim 9, wherein the substrate is a flexible circuit board, or the substrate comprises at least two layers of flexible circuit boards, which are in stacked arrangement.

11. The integrated package circuit according to claim 9, wherein the circuit layer is a functional circuit, or the circuit layer itself constitutes an electronic device.

12. The integrated package circuit according to claim 9, wherein the top surface of the substrate is provided with the circuit layer, or/and the bottom surface of the substrate is provided with the circuit layer, or/and the circuit layer is provided in the substrate, the number of the device pins is at least two, one of the device pins is electrically connected to at least one of the circuit layers, and the other one of the device pins is electrically connected to at least the other one of remaining circuit layers.

13. The integrated package circuit according to claim 10, wherein the top surface of the substrate is provided with the circuit layer, or/and the bottom surface of the substrate is provided with the circuit layer, or/and the circuit layer is provided in the substrate, the number of the device pins is at least two, one of the device pins is electrically connected to at least one of the circuit layers, and the other one of the device pins is electrically connected to at least the other one of remaining circuit layers.

* * * * *